(12) United States Patent
Kolodin et al.

(10) Patent No.: US 8,835,199 B2
(45) Date of Patent: Sep. 16, 2014

(54) PHOSPHOR SUSPENDED IN SILICONE, MOLDED/FORMED AND USED IN A REMOTE PHOSPHOR CONFIGURATION

(75) Inventors: Boris Kolodin, Beachwood, OH (US); Anirudha R. Deshpande, Twinsburg, OH (US)

(73) Assignee: GE Lighting Solutions, LLC, Cleveland, OH (US)

(*) Notice: Subject to any disclaimer, the term of this patent is extended or adjusted under 35 U.S.C. 154(b) by 52 days.

(21) Appl. No.: 13/187,592

(22) Filed: Jul. 21, 2011

(65) Prior Publication Data

US 2012/0025216 A1 Feb. 2, 2012

Related U.S. Application Data

(60) Provisional application No. 61/368,376, filed on Jul. 28, 2010.

(51) Int. Cl.
| | |
|---|---|
| *H01L 33/56* | (2010.01) |
| *H01L 33/50* | (2010.01) |
| *C09K 11/02* | (2006.01) |
| *H01L 33/64* | (2010.01) |
| *H01L 33/58* | (2010.01) |

(52) U.S. Cl.
CPC ......... *C09K 11/02* (2013.01); *H01L 2933/0041* (2013.01); *H01L 33/644* (2013.01); *H01L 2933/005* (2013.01); *H01L 33/507* (2013.01); *H01L 33/58* (2013.01)
USPC .................. 438/27; 438/29; 438/116

(58) Field of Classification Search
USPC ................. 438/27, 29, 116; 257/98, E33.058
See application file for complete search history.

(56) References Cited

U.S. PATENT DOCUMENTS

| | | | |
|---|---|---|---|
| 3,596,136 A | 7/1971 | Fischer | |
| 7,029,935 B2 * | 4/2006 | Negley et al. | 438/29 |
| 7,915,061 B2 * | 3/2011 | Nall et al. | 438/26 |
| 8,039,862 B2 * | 10/2011 | Tran et al. | 257/99 |
| 2005/0051782 A1 | 3/2005 | Negley et al. | |
| 2006/0124953 A1 * | 6/2006 | Negley et al. | 257/99 |
| 2006/0169998 A1 | 8/2006 | Radkov et al. | |
| 2007/0090383 A1 * | 4/2007 | Ota et al. | 257/98 |
| 2008/0029720 A1 | 2/2008 | Li | |
| 2008/0054280 A1 * | 3/2008 | Reginelli et al. | 257/98 |

(Continued)

FOREIGN PATENT DOCUMENTS

| | | |
|---|---|---|
| EP | 1930959 A1 | 6/2008 |
| EP | 2219233 A1 | 8/2010 |

(Continued)

OTHER PUBLICATIONS

Jan Ziegler et al: "Silica-Coated InP/ZnS Nanocrystals as Converter Material in White LEDs", Advanced Materials, Wiley VCH Verlag, DE, vol. 20, No. 21, Nov. 3, 2008, pp. 4068-4073, XP002639985, ISSN: 0935-9648, DOI: 10.1002/ADMA.200800724 [retrieved on Oct. 13, 2008] p. 4072.

(Continued)

*Primary Examiner* — George Fourson, III
(74) *Attorney, Agent, or Firm* — Fay Sharpe LLP

(57) ABSTRACT

A light emitting package comprising a support hosting at least one light emitting diode. A light transmissive dome comprised of a silicone including a phosphor material positioned to receive light emitted by the diode. A glass cap overlies said dome.

13 Claims, 4 Drawing Sheets

(56) References Cited

U.S. PATENT DOCUMENTS

| | | | |
|---|---|---|---|
| 2008/0121911 A1* | 5/2008 | Andrews et al. | 257/98 |
| 2008/0157114 A1* | 7/2008 | Basin et al. | 257/98 |
| 2009/0309485 A1* | 12/2009 | Tamaki et al. | 313/503 |
| 2010/0200874 A1* | 8/2010 | Shioi et al. | 257/91 |
| 2010/0283381 A1* | 11/2010 | Takahashi et al. | 313/503 |
| 2011/0001148 A1* | 1/2011 | Sun et al. | 257/88 |
| 2011/0133222 A1* | 6/2011 | Allen et al. | 257/88 |
| 2011/0198780 A1* | 8/2011 | Basin et al. | 264/266 |
| 2011/0235309 A1* | 9/2011 | Miki et al. | 362/97.2 |

FOREIGN PATENT DOCUMENTS

| | | |
|---|---|---|
| WO | 01/89000 A1 | 11/2001 |
| WO | 2005/004202 A2 | 1/2005 |
| WO | 2010/143086 A1 | 12/2010 |

OTHER PUBLICATIONS

Allen Steven et al: "A nearly ideal phosphor-converted white light-emitting diode", Applied Physics Letters, AIP, American Institute of Physics, Melville, NY, US, vol. 92, No. 14, Apr. 10, 2008. pp. 143309-143309, XP012106419 ISSN: 0003-6951, DOI: 10.106311.2901378 figure 3 p. 143309.

PCT Search Report issued in connection with corresponding WO Patent Application No. US2011/045157 filed on Jul. 25, 2011.

"OEM Design-in guide", Philips Lighting Electronics N. A., Fortimo LED DLM System—Version 1.0.

* cited by examiner

PHOSPHOR SUSPENDED IN SILICONE, MOLDED/FORMED AND USED IN A REMOTE PHOSPHOR CONFIGURATION

This application claims the benefit of U.S. Provisional Application No. 61/368,376, filed Jul. 28, 2010, the disclosure of which is incorporated herein by reference.

This Invention was made with government support under Contract No. DE-EE0003232, awarded by the Department of Energy. The Government has certain rights in this invention.

BACKGROUND

The present exemplary embodiment relates to the lighting arts. It finds particular application in conjunction with light emitting packages based on one or more light emitting chips and to methods for making the same, and will be described with particular reference thereto. However, it is to be appreciated that the present exemplary embodiment is also amenable to other like applications.

Light emitting packages based on semiconductor light emitting chips, such as light emitting diodes (LEDs) are increasingly used for illumination purposes. LEDs consist of semiconducting material doped with impurities to create a p-n junction, wherein current flows from the p-side (anode) to the n-side (cathode). Each LED typically produces radiation that is saturated light at a single color point, such as red light, blue light, green light, violet light, or ultraviolet light over a narrow spectral range. It is known to operatively couple the LED with a wavelength converting phosphor so as to produce a desired light output such as an approximate white light output. It is further known to couple the chip with a transparent lens, which may be a molded encapsulant shaped into a desired lensing configuration, such as a dome.

Referring now to FIG. 1, a prior art LED lamp is disclosed (U.S. Pat. No. 7,029,935), comprised of a mounting substrate 10 which receives a light emitting diode 12. The LED 12 is disposed within an encapsulant 14. A transparent plastic shell 16 includes a phosphor 18. A transparent inner core 19 tills shell 16. In alternative devices, the phosphor is coated directly on the semiconductor light emitting device itself. Alternatively, the phosphor is coated directly on the surface of the shell.

Application No. 2008/0054280, incorporated by reference herein, discloses a light emitting package with a light emitting chip supported by a circuit board. A light transmissive shell is disposed over the light emitting chip in a dome-like shape. A phosphor slurry is spray coated onto the inner surface of the shell, which is then cured. This method provides acceptable color variation; however, this method results in a large amount of phosphor waste due to imprecise control over the coating method.

The present embodiment provides a light emitting package having improved properties and desirable benefits.

SUMMARY OF THE DISCLOSURE

According to one aspect, a method for manufacturing a light package is provided that comprises securing at least one light emitting chip to a board, premixing two or more parts of silicone with phosphor material forming a feedstock, shaping the feedstock into a mold, post-processing the mold to form a silicone shell with phosphors suspended therein, and disposing the shell over the light emitting chip.

According to another aspect, a light emitting package is provided comprising at least one light emitting chip, a board supporting the at least one light emitting chip, and a light transmissive silicone shell including a phosphor material disposed therein. The light transmissive silicone shell is disposed over the light emitting chip.

According to a further aspect, a light emitting package comprising a support hosting at least one light emitting diode is provided. A light transmissive dome comprised of a silicone including a phosphor material is positioned to receive light emitted by the diode. A glass cap overlies said dome.

According to an additional aspect, light emitting package comprised of at least one light emitting diode and a silicone sheet is provided. The sheet receives light emitting by the diode and includes a dispersed phosphor material. A glass component is secured to the sheet.

DETAILED DESCRIPTION

Figure 1:
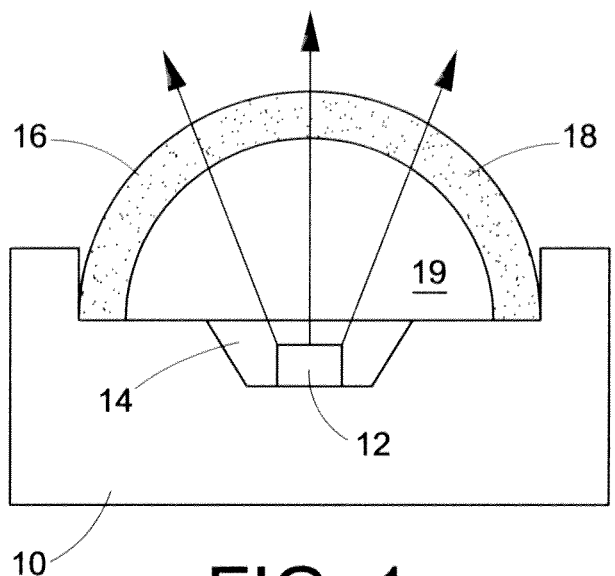
FIG. 1 illustrates a prior art light emitting package.
Figure 2:
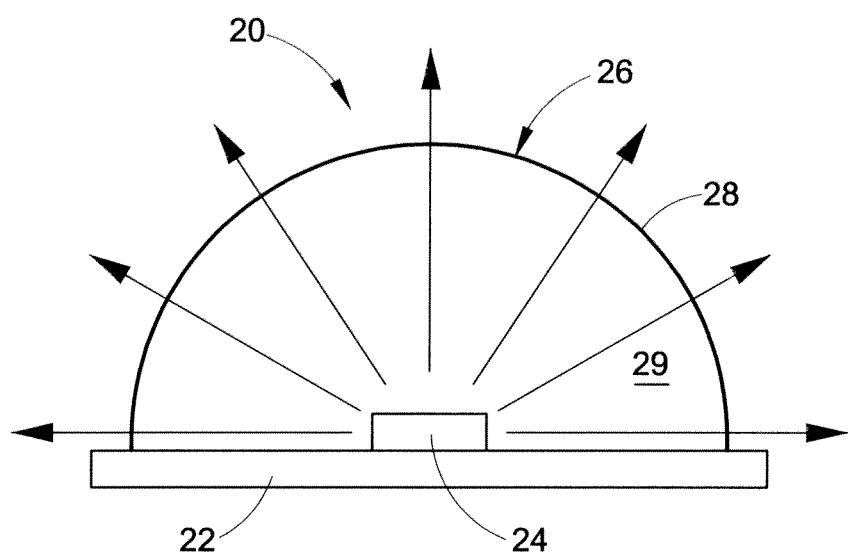
FIG. 2 illustrates an exemplary embodiment of the subject light emitting package.

In accordance with one aspect, FIG. 2 depicts a light emitting package 20 that includes a printed circuit board 22 on which one or more LEDs 24 are disposed. The printed circuit board can be a metal-core printed circuit board, insulated circuit board, or so forth. The number of chips on the board may be one, two, three, four, five, or more. The chips mounted on the board may be of the same kind (for example, four chips each being blue light emitting; however, two or more different kinds of chips may be used. For example, a combination of red, green, and blue chips may be used to collectively approximate white light. The LED chips can be near ultraviolet, violet, blue, green, yellow, orange, red, and/or infrared light emitting diode chips, emitting radiation of wavelength 315 mm and above, for example, 400 nm and above.

In one embodiment, the board is a metal core printed circuit board including a copper plate or other metal core and a printed circuitry layer sandwiched between dielectric layers. Optionally, an additional insulation layer may be disposed over the backside of the metal core layer. Moreover, it is contemplated to include two or more separate and distinct printed circuitry layers. The light emitting chips may be mechanically and/or electrically connected with the printed circuit board in a die attachment process. The die attachment may employ surface-mounting technology, wherein the chips are mounted directly onto the surface of the printed circuit board by soldering. Alternatively, the chips are flip-chip bonded to bonding pads that electrically connect with the printed circuitry layer of the board. Such flip-chip bonding provides both mechanical securing of the chips to the board and electrical input paths for electrically powering the chips. For example, a connector disposed on the hoard suitably enables electrical power coupling to the board to power the chips via the printed circuitry layer.

The LED chips may be lateral chips having both n- and p-electrodes on the same side of the chip and contacting the board by flip chip bonds. In other embodiments, the chips are vertical chips with electrodes are on opposite sides of the chip, and one electrode is soldered or flip-chip bonded to a bonding pad of the board while another electrode on an opposite side of the chip is contacted by wire bonding. In other embodiments, the chip can include two electrodes both contacted by wire bonding, and the chip is soldered to the board to provide mechanical attachment to the board. According to one embodiment, the hoard has a level, horizontal surface and the chip is flat mounted directly on the board, such that the chip is capable of more uniform 180 degree distribution, as compared to the more vertical distribution that occurs when chips are disposed in a recess on the board. The board optionally supports other components operatively connected via the printed circuitry layer or by wire bonding or the like with the light emitting chips. For example, the board may support a Zener diode to provide electrostatic discharge protection, power regulating circuitry, voltage stabilizing circuitry, current-limiting circuitry, rectifying circuitry, or so forth.

A light transmissive silicone shell 26, filled with a phosphor material 28, is provided to receive light from the LED 24. In contrast to the commonly used plastic or glass shells, silicone shows excellent resistance to oxygen, ozone, and UV light. Silicone differs from plastic in that plastic consists of organic carbon in the polymer backbone, while silicones include mixed inorganic-organic polymers having inorganic silicone-oxygen backbone with organic side groups attached to the silicone atoms. Since Silicone has good near UV/blue radiation resistance, silicone light transmissive shells show much better reliability than carbon backbone organic plastics. Transparent methyl based silicones having a Shore A hardness between about 41 and 46, a refractive index greater than about 1.3 and a tensile strength greater than about 5.5 MPa are suitable. One exemplary silicone is RTV-615. Silicones have the ability to improve light extraction from the LED packages. By tailoring silicones, such as, but not limited to, adding organic/inorganic functional groups (groups that are attached to the Si—O backbone in silicones) or addition of nanoparticles (such as but not limited to $TiO_2$, $ZrO_2$ etc.), it is possible to improve the light extraction efficiency in the transmissive shell. By changing the functional groups attached to the Si—O backbone or by changing the arrangement of functional groups it is possible to tailor the refractive index of the silicones between 1.0 to 1.8. Phosphor particles can have a refractive index between 1.0 to 2.0. By using silicones that match the refractive index of phosphors—forward scattering of light can be achieved. By creating an intentional mismatch between the refractive index of silicone and the phosphor particles, scattering in non forward directions can be improved. Scattering of light in forward and non-forward directions is required for better overall light extraction from a diffuse light source. The refractive index matching (or mismatch) between silicones and phosphor particles mentioned here allows for better light extraction efficiency as compared to general organic Carbon back bone based plastics that have no capability for refractive index tailoring and therefore are not as efficient in light extraction.

The silicone light transmissive shell includes at least one phosphor dispersed therein, such that a silicone shell is formed with phosphors suspended inside. The phosphor may be uniformly dispersed within the shell, or alternatively, the phosphor may be dispersed non-uniformly, such as by forming various patterns that affect the intensity, color, or provide various indicia on the shell. The subject silicone/phosphor shell optimizes the particle size distribution of the phosphor. Preferably, the phosphor particles have a mean phosphor particle size $D_{50}$ greater than about 5 micrometers, thereby improving light extraction of the LED package.

The silicone light transmissive shell can be secured to the printed circuit board in various ways, such as by an adhesive, by a friction fit between the perimeter and the goove, by fasteners, or so forth. Use of a thermally conductive epoxy is one good alternative. The silicone light transmissive shell, together with the printed circuit board, defines an interior volume containing the light emitting chips. In some embodiments, the connection between the perimeter of the silicone shell and the printed circuit board is a substantially airtight sealing connection that substantially hermetically seals the interior volume. In other embodiments, the connection between the perimeter and the printed circuit board is not a hermetic seal, but rather may contain one or more gaps, openings, or the like.

The interior volume between the silicone shell and the printed circuit board may be substantially filled with an encapsulant 29. The encapsulant may be, for example, a silicone encapsulant, an epoxy encapsulant, or the like. The encapsulant is transparent to light produced by the LED chips, acts as a refractive index-matching material promoting light extraction out of the LED chips, and preferably also promotes light coupling with the phosphor. The encapsulant may be injected into the interior volume after the silicone shell is sealed to the printed circuit board.

The phosphor is configured to output converted light responsive to irradiation by the light emitting chips. The phosphor is selected to produce a desired wavelength conversion of a portion or substantially all of the radiation produced by the light emitting dice or chips. The term "phosphor" is to be understood as including a single phosphor compound or a phosphor blend or composition of two or more phosphor compounds chosen to produce a selected wavelength conversion, as known in the art. For example, the phosphor may be a phosphor composition including yellow, green, and blue emitting phosphor compounds that cooperatively provide white or substantially white light. This white or substantially white light may, for instance, possess an x value in the range of about 0.30 to about 0.55, and a y value in the range of about 0.30 to about 0.55 in the 1931 CIE chromaticity diagram. In some embodiments, the phosphor can also have an optional red emitting compound for better color rendering. In some embodiments, the light emitting dice or chips are group III-nitride light emitting diode chips that emit violet or near-ultraviolet radiation and the phosphor converts most or all of the light generated by the chips into white or substantially white light. For white output, the phosphor and light emitting chip can be selected to provide a suitable color temperature and color rendering of the lamp. In some embodiments, the light emitting dice or chips are group III-nitride light emitting diode chips that emit blue or bluish radiation and the phosphor is a yellowish phosphor that converts only some of the blue or bluish radiation to yellowish light. The ratio of direct (unconverted) bluish light and converted yellowish light is selected to approximate white light. Those skilled in the art can readily select other phosphors suitable for performing specific light conversions.

Figure 3:
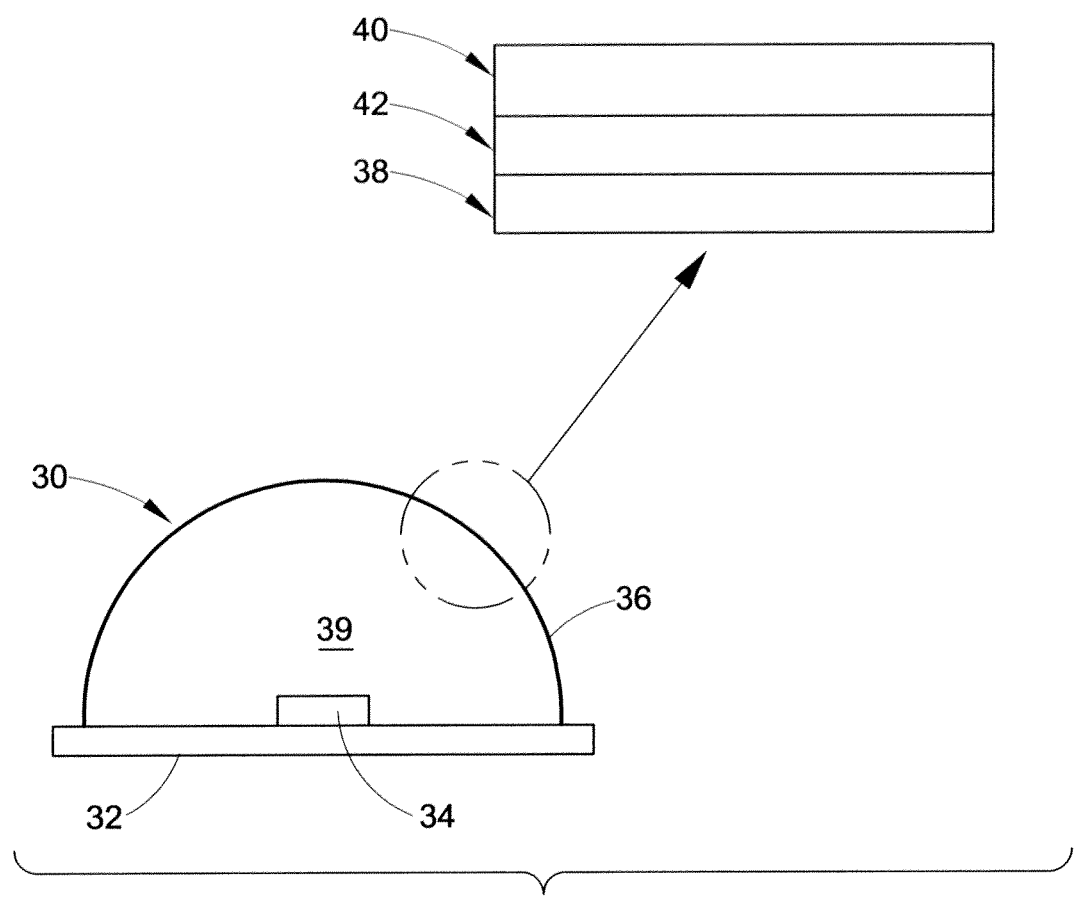
FIG. 3 illustrates a further exemplary embodiment of the subject light emitting package.

Referring now to FIG. 3, the light emitting package 30 can further be fitted with a glass cap. More particularly LED 34 resides on printed circuit board 32. In this instance, the package dome 36 includes the phosphor infused silicone dome 38, a glass cap 40 and an intermediate silicone adhesive layer 42 securing glass cap 40 to silicone dome 38. An encapsulant 39 may also be employed. It may be desirable to secure package dome 36 to printed circuit board 32 with a thermally conductive material such as an epoxy with thermal conductivity of at least 1 w/m/° K, roughly equivalent or better that glass.

It has been found that, in certain applications, the glass cap 40 advantageously acts as a heat sink to prevent the light emitting package from overheating. A package with presently available phosphor materials operated in excess of 110° can suffer reduced phosphor performance. Inclusion of the glass dome has been found to maintain temperature at a desirable range below 110° C. such that good CCT and lumens per watt are obtained. Generally, it has been found that a light emitting package having an outside diameter less than about 20 mm may benefit the most by the inclusion of the heat sinking glass dome. Nevertheless inclusion of a heat sinking glass dome may also have beneficial effect in case of light emitting packages with an outside diameter greater than 20 mm. The glass dome can improve the blue emission of the light emitting package such that the CCT becomes to a cool white color. Moreover, a color shift of up to 300° K can be achieved by the addition of the glass cap. It is also contemplated that a reverse design may be employed wherein the phosphor containing silicone dome resides on top of a glass dome. This can be particularly beneficial in the event that a short pass filter is provided on surface of the glass dome. In this case, the short pass filter placed between the LED and the phosphor layer redirects at least a portion of downward directed white light outside the package. A typical glass material could be low temperature melting glass (less than 400 C melting point), intermediate temperature melting glass (400 C-1000 C) and glasses that can be formed at higher temperatures (1000 C+). Examples include Quartz glass).

It has been further found that the inclusion of a thermally conductive particulate in the silicone shell can have advantageous effects on thermal properties. For example, aluminum nitride, alumina, or indium tin oxide can function as thermal conductors in this environment. Preferably, the thermal conductors are comprised of a small size particle such as between 5 nanometers and 15 microns. Perhaps even more desirable are nanoparticles having a diameter of less than 10 nanometers which have a transparent property. The thermal conductor can comprise up to about 50% of the loading of material within the silicone but it is generally believed at least 50% of the loading should be comprised of the phosphor material.

The silicone/phosphor shell described herein creates a remote phosphor configuration, thereby eliminating the loss of light due to absorption that occurs when phosphors are too close to the LED and photons produced by the phosphors are diverted back toward the LED chip.

Figure 4:
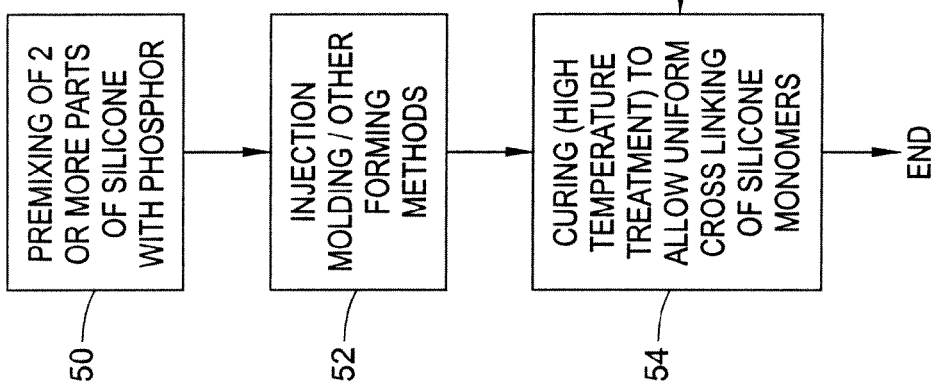
FIG. 4 illustrates a flow chart of an exemplary process of forming the present silicone light transmissive shell.

Referring now to FIG. 4, a flow chart of a suitable manufacturing process is set forth. The silicone/phosphor shell can be prepared by premixing two or more parts. Generally, a two part silica is advantageous because the second part helps with the crosslinking. Additional parts/components could be added to promote optical/thermal/electrical etc. properties. These additives can be added to either the first or second part of silicone with a phosphor material to form a feedstock (step 50). The feedstock is preferably formed into shapes, such as a sheet or dome, using forming methods such as injection molding and the like (step 52). In one example, the feedstock is injected into a mold providing domes. Alternatively, the silicone/phosphor shell can be overmold directly within the glass dome. The feedstock should be fluid enough to be forced into a shaped cavity. Once inside the cavity, the feedstock acquires the shape of the cavity. The injection molded parts are then post-processed to form silicone components with phosphors suspended inside. The post-processing may include baking or curing to allow uniform cross-linking of the silicone monomers (step 54). As opposed to simply allowing a molten liquid to solidify, curing the silicone/phosphor material allows for improved reliability and resistance when exposed to near UV or blue radiation. Parameters such as the amount of phosphor, types of phosphors used, particle size distribution of these phosphors included in the feedstock, viscosity, etc. of the silicone dictates the emitting characteristics of the molded dome.

Figure 5:
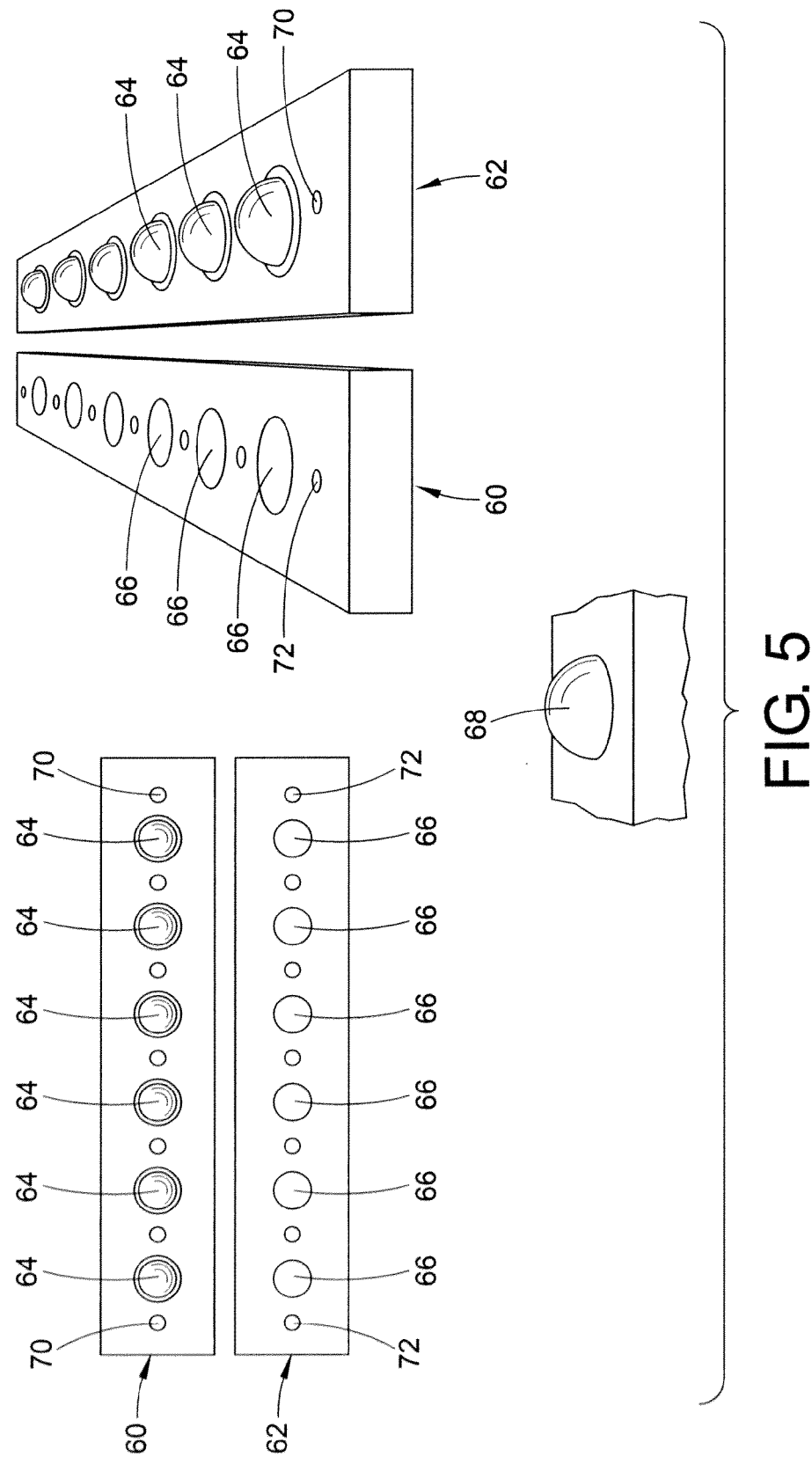
FIG. 5 illustrates an exemplary mold for forming the silicone shells.

Referring now to FIG. 5 (top view, end perspective view, and extracted dome), the molds can comprise cooperation halves 60 and 62, which include corresponding projections 64 and recess 66. The projection/recess are shaped to create a cavity in which silicone domes 68 can be molded. Registration tabs 70 and receptacles 72 are provided to establish proper mating of mold halves 60 and 62.

The use of a silicone shell with phosphors suspended therein allows for a very precise control over the amount of phosphor being utilized in the manufacturing of remote phosphor LED products. Such precise control allows for reduction of waste in phosphor materials during the manufacturing process. The silicone shells provided herein further provide the ability to improve upon color variation in the remote phosphor geometry. Further, the subject light emitting package optimizes particle size distribution or the phosphor, thereby improving light extraction, which involves getting light emitted from the p-n junction in an LED to the surroundings. Moreover, the combination of all the above elements provides a white light with color temperature between about 2500K and 10,000K with CRI between about 70 to 100.

Figure 6:
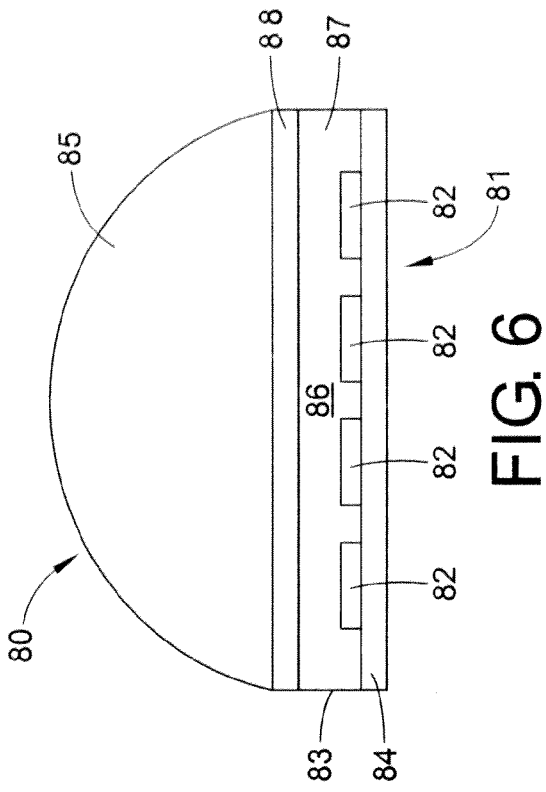
FIG. 6 illustrates a further exemplary embodiment of the subject light emitting package.

The aforementioned lighting package is described as including a dome-shaped light transmissive shell; however, the silicone light transmissive lens may be formed in various shapes as desired to fit a particular application. Referring now to FIG. 6, the silicone light transmissive shell may alternatively be in the form of a sheet. More particularly, the light emitting package 80 includes a light engine 81 comprised of a plurality of LEDs 82 disposed on a substrate 84, such as a PCB within a housing 83. Also secured to the housing 83 is a phosphor infused silicone sheet 88 disposed to receive a light emitted from the LEDs 82. A glass cap 85 is disposed on sheet 88 to provide heat sinking thereto. Glass cap 85 can be hollow or at least substantially solid. A thermally conductive adhesive can be used to form this junction. A mixing chamber 86 can ensure perfectly mixed light, resulting in uniform colors and good color consistency. A light transmissive encapsulant 87 may fill the interior of mixing chamber 86. This package provides the ability to create a remote-phosphor configuration, while being ideal for spaced constrained lighting applications.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A method for manufacturing a light emitting package, the method comprising:
   securing at least one light emitting chip to a board;
   premixing two or more parts of silicone with phosphor material forming a feedstock;
   shaping said feedstock within a glass dome remote from the at least one light emitting chip to form a silicone shell;
   post-processing said silicone shell with phosphors suspended therein;
   disposing said shell and dome over and remote from said light emitting chip;

securing said shell and dome to said board; and wherein said glass dome is in thermal communication with said silicone shell and said board.

2. The method of claim 1 further comprising filling an interior volume between the silicone shell and the board with an encapsulant.

3. The method of claim 1 wherein said securing steps comprise application of a thermally conductive adhesive.

4. The method of claim 1 wherein said silicone shell includes a diameter of greater than about 20 mm.

5. The method of claim 1 wherein said phosphor material comprises a mixture of different phosphors emitting to create a white light blend.

6. The method of claim 1 wherein said securing step employs an adhesive having a thermal conductivity of at least 1 w/m/° K for securing said shell and dome to said board.

7. The method of claim 1 wherein said silicone comprises a transparent methyl based silicone having a shore A hardness between about 41 and 46, a refractive index greater than about 1.3 and a tensile strength greater than about 5.5 MPa.

8. The method of claim 1 wherein said silicone and said dome are concentrically shaped.

9. The method of claim 1 wherein said silicone includes a thermally conductive filler.

10. The method of claim 9 wherein said filler is selected from $Al_2O_3$, ITO, AlN and mixtures thereof.

11. The method of claim 9 wherein said filler has an average particle size of about 10 nm.

12. The method of claim 1 comprising at least two light emitting diodes disposed within said dome.

13. The method of claim 1 wherein said post-processing comprises thermal cross-linking.

\* \* \* \* \*